United States Patent [19]
Goto

[11] Patent Number: 5,721,079
[45] Date of Patent: Feb. 24, 1998

[54] PROCESS FOR POSITIONING A MASK RELATIVE TO A WORKPIECE AND DEVICE EXECUTING THE PROCESS

[75] Inventor: Manabu Goto, Yokohama, Japan

[73] Assignee: Ushiodenki Kabushiki Kaisha, Tokyo, Japan

[21] Appl. No.: 540,390

[22] Filed: Oct. 6, 1995

[30] Foreign Application Priority Data

Oct. 6, 1994 [JP] Japan ................... 6-242532

[51] Int. Cl.$^6$ ........................................ G03F 9/00
[52] U.S. Cl. ........................... 430/22; 356/401
[58] Field of Search ................ 430/22, 5; 356/400, 356/401

[56] References Cited

U.S. PATENT DOCUMENTS

| | | | |
|---|---|---|---|
| 4,561,773 | 12/1985 | Hiroshi | 355/43 |
| 4,616,130 | 10/1986 | Takashi | 350/201 |
| 4,922,290 | 5/1990 | Yasuhiro et al. | 355/53 |
| 5,159,496 | 10/1992 | Yoshikazu | 359/754 |
| 5,279,911 | 1/1994 | Kamon et al. | 430/22 |
| 5,443,932 | 8/1995 | Ohta et al. | 430/22 |

*Primary Examiner*—S. Rosasco
*Attorney, Agent, or Firm*—Sixbey, Friedman, Leedom & Ferguson; David S. Safran

[57] ABSTRACT

An exposure device in which alignment is performed using light with wavelengths which are different from those of the exposure light, to position the mask to the workpiece with high accuracy by the magnification factor in emission of exposure light being brought into agreement with the magnification factor for emission of nonexposure light. Changes in the focal length and movements of the main planes of the projection lens due to the different wavelengths are taken into consideration in adjusting the distance between the mask and the projection lens and the distance between the projection lens and the workpiece. In this way, the length of the optical path of the optical system is adjusted such that the magnification factor in the emission of nonexposure light matches the magnification factor in emission of exposure light. Then, the nonexposure light is emitted onto a mask, and the workpiece drive carrier or the mask drive carrier is moved such that the alignment identifier of the workpiece with the alignment identifier of the mask come to lie one on top of the other. Furthermore, instead of adjusting the distance between the mask and the projection lens and the distance between the projection lens and the workpiece, an optical part such as a parallel flat plate or the like is inserted into the optical path for adjusting its length.

10 Claims, 12 Drawing Sheets

FIG. 11
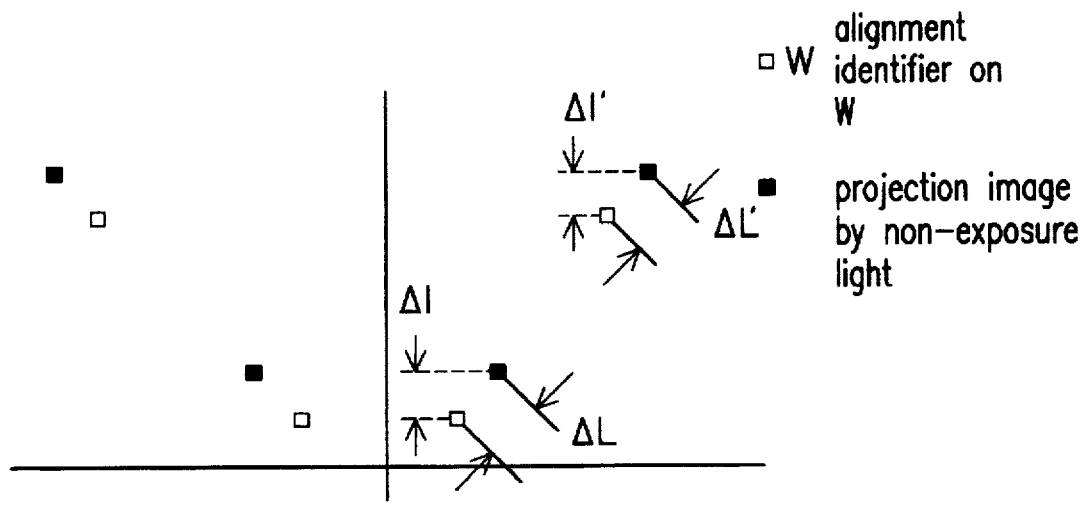
FIG. 12
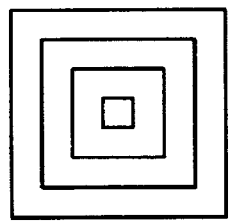
projection image of the mask pattern by the exposure light
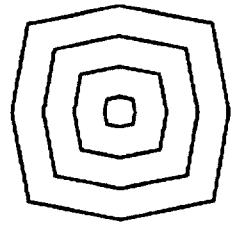
projection image of the mask pattern by the non-exposure light — : Light beam when the parallel flat plate is not inclined ---- : Light beam when the parallel flat plate is inclined parallel flat plate

1

PROCESS FOR POSITIONING A MASK RELATIVE TO A WORKPIECE AND DEVICE EXECUTING THE PROCESS

BACKGROUND OF THE INVENTION

1. Field of the Invention

The invention relates to process for positioning a mask relative to a workpiece, and to a device for executing the process in an exposure device which is used for the production of a semiconductor device, a printed board, and an LCD (liquid crystal display) and for similar purposes.

2. Description of Related Art

Production of electrical and electronic components and parts of various types in which processing of structures in the micron range is necessary comprises the exposure process. These electronic parts are semiconductor components, liquid crystal displays, printer heads of inkjet systems, multichip modules in which a host of different electronic components are produced on a substrate, and thus, a module is formed, and the like.

In this exposure process, in the case of transfer of patterns of a workpiece and a mask, it is important to exactly position relative to a preformed pattern, a pattern which is to be subsequently transferred. The above described positioning is ordinarily done in such a manner that the alignment identifiers, which can also be called the positioning marking, of the mask and the workpiece come to rest on top of one another.

As automatic devices for transfer of a mask pattern, exposure devices of the projection type are known in which positioning is done using exposure light, for example an i-line, an h-line or a g-line (i-line: 365 nm wavelength, h-line: 405 nm wavelength, g-line: 436 nm wavelength), or in which positioning is done using nonexposure light, for example, an e-line, a d-line or a c-line (e-line: 546 nm wavelength, d-line: 588 nm wavelength, c-line: 656 nm wavelength).

In the devices mentioned first, in the region used for positioning, a circuit pattern cannot be formed since, in the course of positioning, the photoresist is exposed to the action of exposure light, as is shown in FIG. 9. As is shown in the drawing, in region A on workpiece W in which workpiece alignment identifiers WA are recorded, a circuit pattern cannot be formed, but only in region. B (cross hatched in the drawing) can a circuit pattern be formed.

In the case in which the yield from a workpiece is to consist of a host of chips, as in semiconductor components, their number decreases according to the area used for the positioning marking. Therefore, the disadvantage arises that the efficiency of production suffers.

On the other hand, in the devices mentioned last, the advantage arises that the region of the circuit pattern is not limited by the positioning region since the photoresist is not exposed to the action of exposure light during positioning.

However, it is considered a disadvantage that, as the result of the different wavelengths of the exposure light and the nonexposure light, the mask pattern is not projected onto the same place.

FIG. 10 shows a schematic of an arrangement of the conventional exposure device in which positioning is done using the above described e-line. In the drawing reference number 1 labels an emission device of exposure light, reference number 1a labels a shutter, reference number 1b an optical filter and reference number 1c a condenser lens.

Reference number 2 is a mask drive carrier on which by means of a suction device (vacuum chuck) or the like a mask M is secured, and which is driven by means of a drive device (not shown) in the x-y-z-Θ directions (x-axis, y-axis: orthogonal axes on a plane parallel to the mask surface, z-axis: an axis in the direction up and down in the drawing, Θ-axis: an axis of rotation around the z-axis). Furthermore, a mask pattern and mask alignment identifiers MA which are hereafter called a "mask identifier" are recorded on mask M for purposes of positioning.

Reference number 3 indicates a projection lens and reference letter W labels a workpiece on which workpiece alignment identifiers WA, which are hereafter called the "workpiece identifier", is recorded for purposes of positioning.

Reference number 6 labels an alignment unit which consists of lens 6a, objective lens 6b, half mirror 6c and an image converter 6d provided with a CCD camera. Workpiece identifier WA and mask identifier MA projected onto workpiece W are detected via half mirror 6c—objective lens 6b—lens 6a by means of image converter 6d, and the positions of the two identifiers are observed. The alignment unit can, furthermore, also be located in region A or C in the drawing in addition to region B in the drawing.

In the drawing, when workpiece W is exposed, the e-line is emitted first from the emission device of exposure light 1 as nonexposure light, by means of alignment unit 6, workpiece identifiers WA and mask identifiers MA projected onto workpiece W are observed and the mask M or the workpiece W is moved in the x-y direction such that the two agree with one another. After completed positioning, the i-line is then emitted as exposure light from the exposure light emission device 1, the mask pattern is projected onto workpiece W and exposure is performed.

Here, in the case of using the i-line as exposure light and the e-line as nonexposure light, due to the different wavelengths of the two lines, the following disadvantages arise:

1) In a projection lens which is built such that no imaging error or aberration, respectively, occurs at the exposure wavelengths, at the nonexposure wavelengths, a deviation of the mask pattern projection surface does occur. This means that the mask pattern is not projected onto the same surface as is labelled using I and E in the figure.

2) The position of mask identifiers MA' on mask pattern projection surface E by the e-line and the position of mask identifier MA on mask pattern projection surface I by the i-line do not agree with one another due to chromatic aberration of the magnification factor.

This means that the distance between projection lens 3 and mask pattern projection surface E produced by the e-line becomes greater than the distance between projection lens 3 and mask pattern projection surface 1 produced by the i-line and the distance Le of mask identifiers MA' on mask pattern projection surface E produced by the e-line becomes greater than distance Li of mask identifiers MA on mask pattern projection surface I produced by the i-line, as shown in the figure.

Furthermore, the position of the projection image of the mask identifiers MA' on mask pattern projection surface E is changed by the position of the alignment identifier. This means that different values for distances ΔL and ΔL' between the workpiece identifier and the projected mask identifiers are obtained, as is shown in FIG. 11. In addition, the mask pattern formed by the nonexposure light is distorted, as is shown in FIG. 12.

Conventionally, therefore, the deviation of the projection surface was corrected by the fact that a parallel flat plate was inserted in the optical path of the projection optics system, and according to the wavelengths of the nonexposure light, the thickness of the flat plate was changed or the inclination thereof adjusted (Japanese patent HEI 5-43168).

In the above described prior art, the deviation of the projection image by the exposure light and the nonexposure light is corrected by inserting the parallel flat plate between the projection lens and the workpiece, the property being used that by inserting the parallel flat plate in the optical path, the focal position deviates by S, as is shown in FIG. 13.

The parallel flat plate has the property that it has no effect on the imaging characteristic of the optical system, even if it is moved in the direction of the optical axis and in the direction perpendicular to the optical axis. Also, the advantage arises that it is not necessary to insert in the parallel flat plate with high positioning accuracy, so that prompt switchover can be achieved.

The above described prior art, however, has the following disadvantages:

(1) As shown in FIG. 11, the position of the projection image of the mask identifiers are changed by the nonexposure light depending on the position of the alignment identifiers. It is, therefore, necessary to insert the parallel flat plate between the mask and the projection lens, to adjust its inclination and to correct the position deviation by the position of the alignment identifiers. The workpiece is ordinarily exposed roughly eight times. The alignment identifiers are, therefore, present at eight points, so that the inclination of the parallel flat plate must be adjusted each time; this is considered a disadvantage for practical use.

(2) If the wavelength for exposure and the wavelength for alignment change, the amount of focal correction changes. It is, therefore, necessary to make available the parallel flat plate according to a combination of the above described wavelengths.

If the amount of focal correction by the parallel flat plate is labelled ΔS, the thickness of the parallel flat plate is labelled d and the index of refraction is labelled N, as shown above in FIG. 13, the amount of focal correction ΔS can be computed according to the following equation $$\Delta S = ((N-1)/N)d$$

It is necessary to fix thickness d of the parallel flat plate according to the wavelength for exposure and the wavelength for alignment since the parallel flat plat is inserted in order to correct the focal errors which are caused by the difference between the wavelength for exposure and the wavelength for alignment.

FIG. 14 illustrates the focal position as a function of wavelength. As is apparent from the drawing, the errors also change if the combination of wavelengths changes. For example, an amount of focal correction ΔS1 is obtained in the case in which the wavelength for exposure is 405 nm and the wavelength for alignment is 546 nm, while an amount of focal correction of ΔS2 is obtained if the wavelength for exposure is 436 nm and the wavelength for alignment is 578 nm.

This means that the thickness of the parallel flat plate must be changed according to the combination of wavelength for exposure and wavelength for alignment. In practice, however, there are a host of applications in which the combination of the wavelengths is changed for exposure depending on the resist to be used and the substrate of the workpiece to treated.

When the parallel flat plate is used, as in the above described conventional example, therefore, it is considered disadvantageous that the parallel flat plates must be made available according to the number of the combinations of the wavelength for exposure and wavelength for alignment and the parallel flat plates in conjunction with the combinations must be inserted in, and that therefore the inserting device is complicated.

(3) If the parallel flat plate in the optical path of the projection optics system is inserted in such that it is inclined with reference to the optical axis, a position deviation occurs in the optical path.

FIG. 15 schematically shows a deviation of the optical path in the case in which the parallel flat plate is inserted in the optical path such that it is inclined relative to the optical axis.

As is shown in the drawing, a position deviation of ΔY occurs if the parallel flat plate with a thickness of d (mm) is inclined with reference to the optical axis by Θ (radiant). This position deviation ΔY can be determined according to the following formula if the index of refraction of the parallel flat plate is designated N.

$$\Delta Y = ((N-1)/N)d \cdot \Theta$$

If the inclination of the parallel flat plate is different in each alignment, therefore, a subtle position deviation occurs and high alignment accuracy cannot be obtained. In particular, in the case in which the parallel flat plate is inserted at high speed, the inclination thereof is an unavoidable problem.

(4) To adjust the magnification factor, an optical part is used which consists of the parallel flat plate. It is, therefore, necessary also to arrange a holding device for this purpose. Especially in the case in which the optical part is inserted and removed, the disadvantage arises that the device becomes complicated and at the same time large.

(5) The disadvantage arises that the workpiece is fouled by the formation of dust, since the inserting device of the parallel flat plate is directly above the workpiece.

SUMMARY OF THE INVENTION

The invention was made with consideration of the above described disadvantages of the prior art. Therefore, a primary object of the invention is to devise a process for positioning of a mask to a workpiece in which, in an exposure device in which alignment is performed using light with wavelengths which are different from that of the exposure light, positioning of the mask relative to the workpiece can be achieved with high accuracy by the magnification factor in emission of exposure light and the magnification factor for emission of nonexposure light being brought into agreement with one another.

Another object consists in devising a device for executing the process.

The above described object is achieved according to the invention by the fact that, with consideration of changes in the focal length and movements of the principal planes of the projection lens by wavelengths, the length of the optical path of the optical system is adjusted such that the magnification factor in the emission of nonexposure light agrees with a magnification factor in emission of exposure light, that the nonexposure light is emitted onto a mask, that the alignment identifiers of the workpiece and the alignment identifiers of the mask are detected, and that the workpiece or the mask is moved parallel to a workpiece/mask surface, such that the alignment identifiers of the workpiece and the alignment identifiers of the mask come to lie one on top of the other.

The above described objects are also achieved according to the invention by the fact that, by movement of at least two of the following parts, specifically the mask, the projection lens or the workpiece, the distances relative to one another is adjusted, and that the adjustment is executed such that the magnification factor in the emission of the nonexposure light agrees with the magnification factor in the emission of the exposure light.

The above described objects are achieved, additionally, according to the invention by the fact that, between the mask and the projection lens or between the projection lens and the workpiece an optical component is inserted for purposes of focal length correction, that, at the same time, the distance is adjusted between the projection lens and the workpiece or between the mask and projection lens where the above described optical component is not inserted, and that the adjustment is accomplished such that the magnification factor in the emission of nonexposure light agrees with the magnification factor in the emission of exposure light.

The above described objects are achieved according to the invention also by the fact that, between the mask and the projection lens as well as between the projection lens and the workpiece, the optical component is inserted for purposes of focal length correction, and that the adjustment is accomplished such that the magnification factor in the emission of nonexposure light agrees with the magnification factor in the emission of exposure light.

Further, the above described objects are achieved according to the invention by the fact that in the device for positioning the mask relative to a workpiece which has an emission device for emission of ultraviolet rays onto a mask, a mask, a mask drive carrier for movement of the above described mask, a projection lens, a workpiece, a workpiece drive carrier for movement of the above described workpiece, an image recording means for image recording of alignment identifiers of the workpiece and alignment identifiers of the mask, and a control means for control of the movements of the mask drive carrier and the workpiece drive carrier, the control means takes into account changes of the focal length and the movements of the principal planes of the projection lens by wavelengths, that the length of the optical path of the optical system is adjusted such that the magnification factor in emission of nonexposure light agrees with the magnification factor in emission of exposure light, that the nonexposure light is emitted onto the mask, and that the workpiece drive carrier or the mask drive carrier is moved parallel to the workpiece/mask surface such that the alignment identifiers of the workpiece and the alignment identifiers of the mask dome to lie one on top of the other.

Furthermore, by means of the measure according to the invention, it is possible to avoid the disadvantage that the different position of the alignment identifier causes a difference between the magnification factors as was illustrated above in FIG. 11. This disadvantage is completely eliminated especially for symmetrical lenses of 1:1 or symmetrical lenses in which the scale on one side was changed (with a similar figure).

Furthermore, the magnification factor in the emission of light with the exposure wavelengths and the magnification factor in the emission of light with the nonexposure wavelengths can, likewise, be made the same size if, instead of the above described movement of the two positions of the workpiece and the mask relative to the projection lens, only the workpiece or the mask is moved relative to the projection lens, and the optical part, such as the parallel flat plate or the like, is inserted between the mask or the workpiece which was not moved and the projection lens.

According to the invention based on the above described principle the magnification factor in the emission of light with the nonexposure wavelengths and the magnification factor in the emission of light with the exposure wavelengths are brought into agreement with one another and thus positioning of the mask to the workpiece is done.

In the invention, by the measure in which the changes of the focal length and the movements of the principal planes of the projection lens are taken into account by the wavelengths at which the length of the optical path of the optical system is adjusted such that the magnification factor in the emission of light with the nonexposure Wavelengths agrees with the magnification factor in the emission of light with the exposure wavelengths at which the nonexposure light is emitted onto the mask and at which alignment is done, the occurrence of the problem of position deviation of the mask identifier projected onto the workpiece is prevented by the position of the alignment identifier and the alignment can be done with high precision by the nonexposure light using a simple device.

In the invention, by means of the measure by which at least two of the following parts, specifically the mask, the projection lens or the workpiece, are moved jointly and the distances to one another adjusted, alignment can be done with great precision by the nonexposure light using a simple device without using the parallel flat plate or the like. Furthermore in doing so the occurrence of position deviation as the result of the inclination of the flat plate is prevented. In addition, this measure can also be easily taken in the case of altered exposure light and altered alignment light.

Furthermore, according to the invention, the workpiece is prevented from becoming fouled by the formation of dust when the parallel flat plate is inserted in and removed since it is not necessary to insert the parallel flat plate in the optical path.

In the invention, by the measure in which the optical component is inserted between the mask and the projection lens and/or between the projection lens and the workpiece for purposes of focal correction and in which the distance is adjusted between the projection lens and the workpiece, or between the mask and the projection lens, where the above described optical component is not inserted, alignment by the nonexposure light can be performed without moving the workpiece drive carrier or the mask drive carrier in the direction of the optical axis, the effect of the position deviation on accuracy, when the carrier moves, can be eliminated, and thus, alignment can be achieved with high precision.

BRIEF DESCRIPTION OF THE DRAWING

FIG. 5 shows an example of an arrangement of the device for reciprocating motion in schematic form and with an encircled detail broken out in enlarged from;

FIG. 11 depicts the positions of the alignment identifier on a mask pattern projection surface with the conventional device;

FIG. 12 shows a schematic of distortion of the mask pattern by the nonexposure light with a conventional device;

DETAILED DESCRIPTION OF THE PREFERRED EMBODIMENTS

Figure 1:
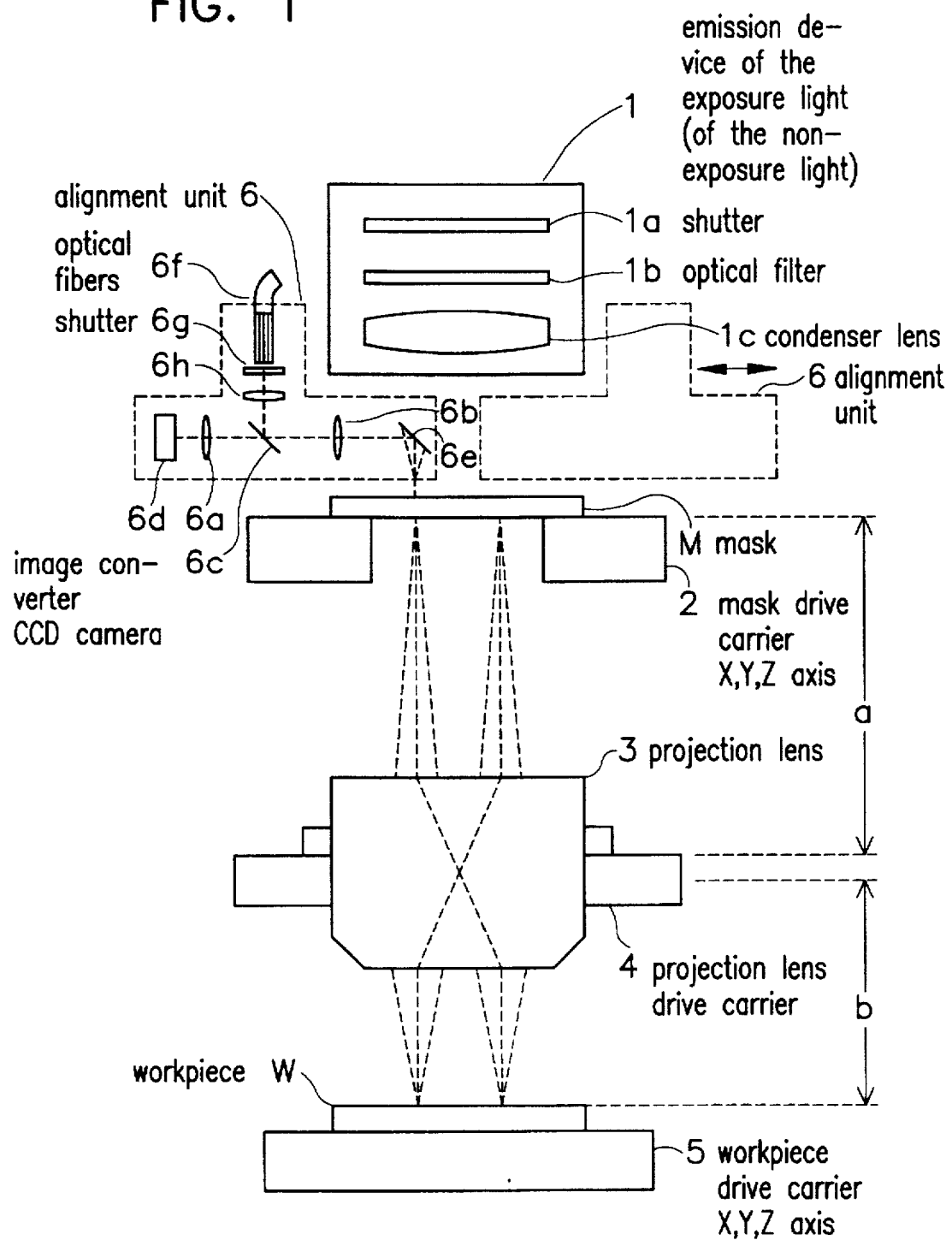
FIG. 1 is a schematic depiction of a first embodiment of the invention.

FIG. 1 is a schematic of an arrangement of an exposure device according to a first embodiment of the invention in which a light emission device 1 has a shutter 1a to control the emission of exposure light and nonexposure light, an optical filter 1b and a condenser lens 1c. In this case, the light which is emitted from an ultraviolet lamp (not shown) is incident, via the shutter 1a and optical filter 1b, on condenser lens 1c, and is converted by means of the condenser lens 1c into parallel light which is then incident on a mask M.

A mask drive carrier 2 has a means for attaching mask M, such as a suction device or the like, and the carrier 2 is driven by means of a drive device (not shown) in the x-y-z-Θ directions (x-axis, y-axis: two orthogonal axes on a plane parallel to the mask surface, z-axis: an axis in the direction up and down in the drawing, Θ-axis: an axis of rotation around an axis perpendicular to the mask carrier). Furthermore, a mask pattern and mask identifiers are recorded on mask M for purposes of positioning.

A projection lens 3 has a projection lens drive carrier 4 for moving the projection lens in the z-direction. Furthermore, a workpiece W is positioned on a workpiece drive carrier 5 which has a means for attachment of the workpiece, as in mask drive carrier 2, and which is driven by a drive device (not shown) in the X-Y-Z-Θ directions. Additionally, workpiece identifiers are recorded on workpiece W for purposes of positioning.

An alignment unit 6 is comprised of a lens 6a, an objective lens 6b, a half mirror 6c, image converter 6d, mirror 6e, optical fibers 6f, shutter 6g and lens 6h, as is shown in the drawing. In this case, the nonexposure light is emitted from a light source onto the mask identifier and the workpiece identifier via optical fibers 6f—shutter 6g—lens 6h—half mirror 6c—lens 6b—mirror 6e. Reflected light is detected via the mirror 6e—objective lens 6b—half mirror 6c—lens 6a by means of the image converter 6d, and thus, alignment is performed.

As is shown in the drawing, in this case, there are at least two alignment units 6. By means of the two alignment units, two alignment identifiers recorded on the workpiece/mask are observed, and in this way, positioning of mask M relative to the workpiece W is performed, as is described below.

Alignment units 6 can, furthermore, be moved in the direction of the adjacent horizontal arrow shown in the drawing. Each alignment unit is inserted during alignment into the position shown in the figure and is inserted back (away from exposure device 1) during exposure. In the case in which the alignment unit is located outside the exposure area, it is not necessary to move the alignment unit out of the way.

Figure 2:
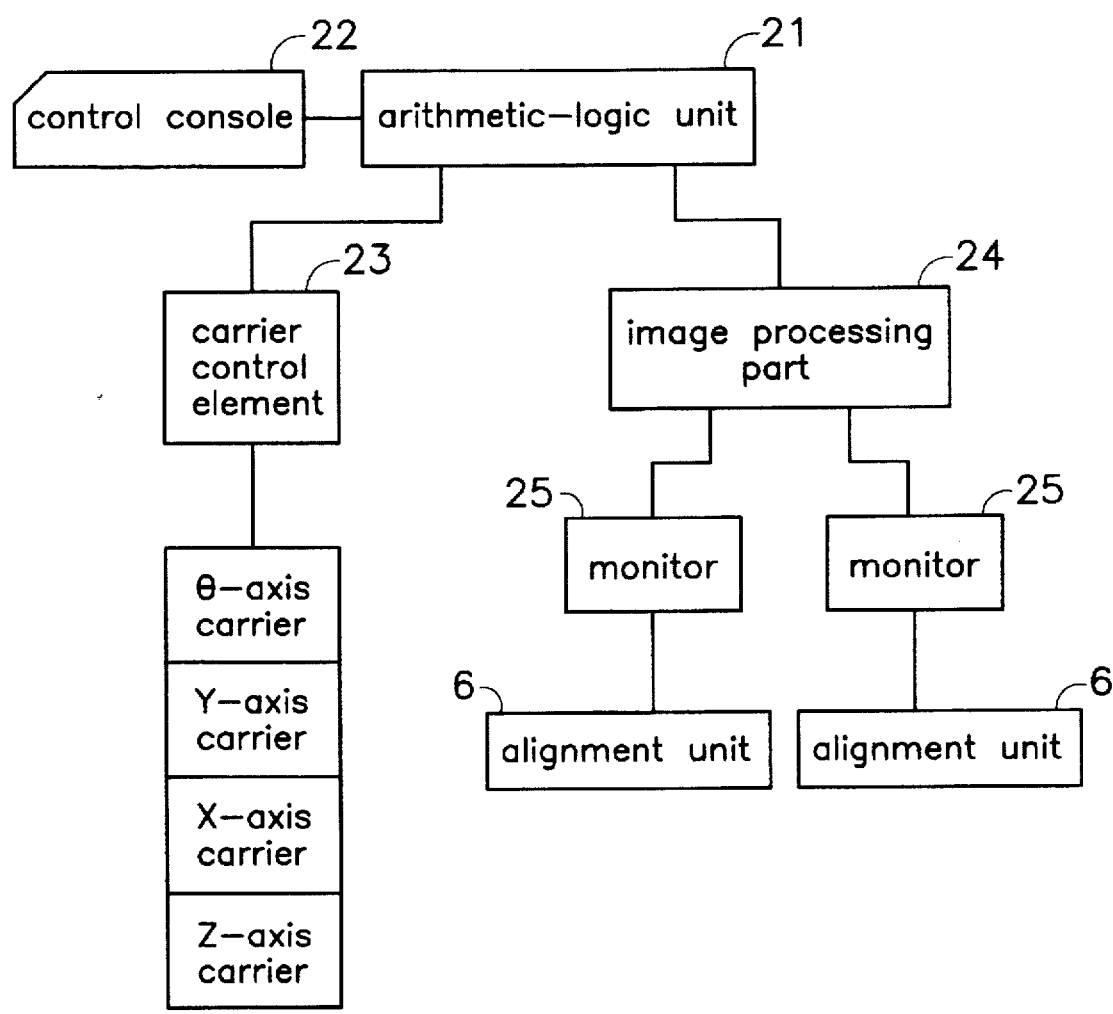
FIG. 2 schematically shows an arrangement of the control device according to the embodiments of the invention.

FIG. 2 is a schematic of an arrangement of a control device of the FIG. 1 embodiment of the invention. In the drawing, an arithmetic-logic unit 21, a control console 22, and a carrier control element 23 are shown. The carrier control element 23 controls an x-carrier, a y-carrier, a z-carrier and a Θ-carrier of mask drive carrier 2, projection lens drive carrier 4 and the workpiece drive carrier 5, shown in FIG. 1.

An image processing part 24 in which the mask identifier and the workpiece identifier detected by image converter 6d of alignment unit 6 of FIG. 1 are displayed by monitor 25.

Figure 3A:
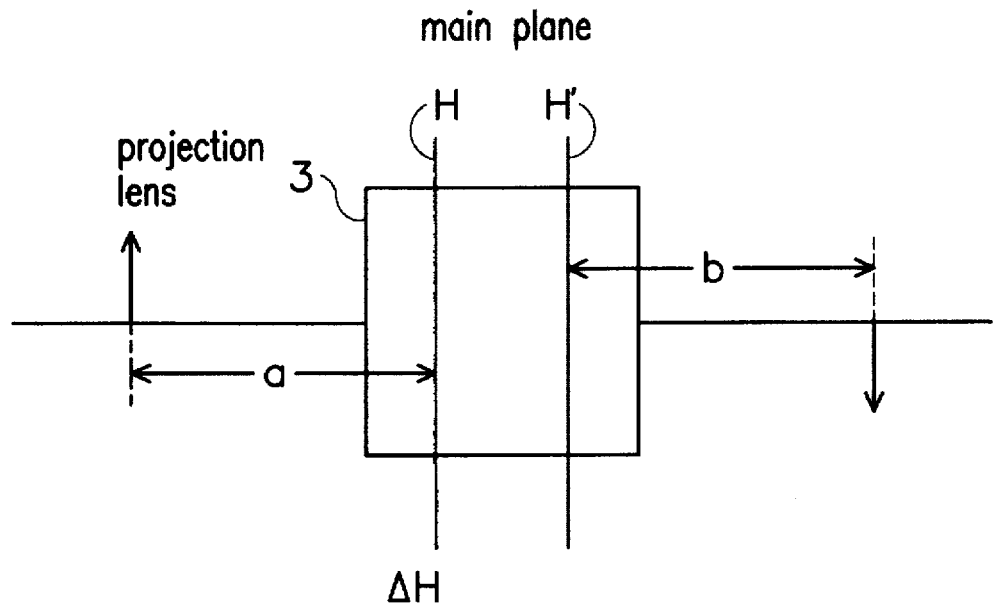
FIGS. 3a & 3b are diagram showing a principle according to the invention.

If, in FIG. 3(a), the focal length for the light with exposure wavelengths of projection lens 3 is labelled f, the following formula is obtained:

$$(1/a)+(1/b)=(1/f) \tag{1}$$

Furthermore, a magnification factor m can be determined according to the following formula:

$$m=b/a \tag{2}$$

Figure 3B:
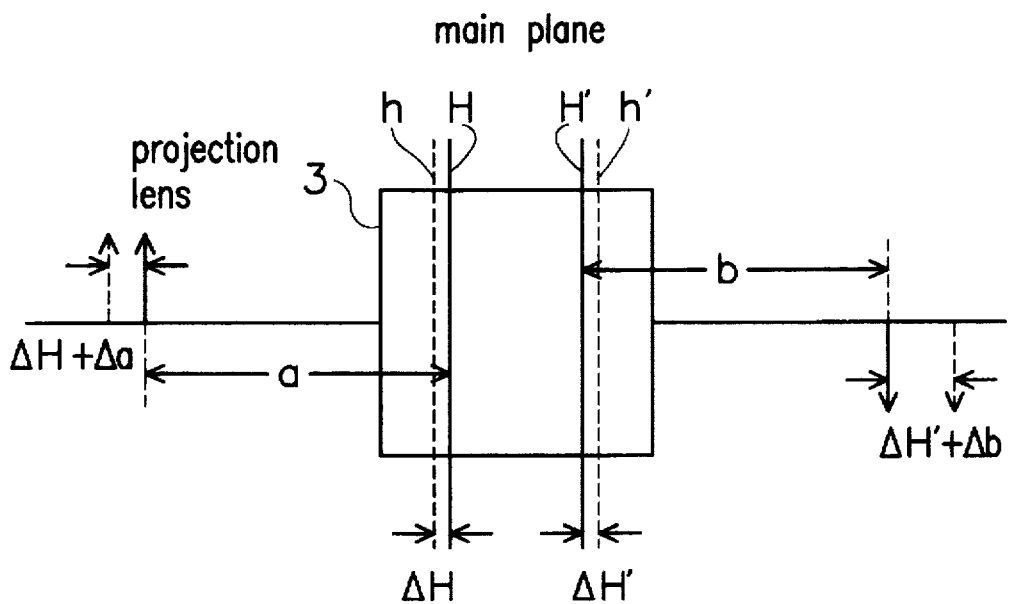

In FIG. 3(a), reference symbols H and H' designate the principal planes of the projection lens for the light with exposure wavelengths. In the case of light with nonexposure wavelengths, which differ from the wavelengths of light with the exposure wavelengths, the focal length is computed by f+Δf, and the following formula as is illustrated in FIG. 3(b) is obtained:

$$(1/(a+\Delta a))+(1/(b+\Delta b))=(1/f+\Delta f) \tag{3}$$

The magnification factor designated m', m' can be computed according to the following formula:

$$m'=(b+\Delta b)/(a+\Delta a) \tag{4}$$

In FIG. 3(b) reference symbols h and h' designate the principal planes of the projection lens in light with nonexposure wavelengths.

In order to make the magnification factors the same size, the magnification factor m for light with the exposure wavelengths and the magnification factor m' for light with the nonexposure wavelengths must be made the same, that is, the formula m=m' must be satisfied. Therefore, the following relations can be obtained from the aforementioned formulas (1), (2), and (4):

$$b/a=(b+\Delta b)/(a+\Delta a)$$

$$b(a+\Delta a)=a(b+\Delta b)$$

$$b\Delta a=a\Delta b$$

$$\Delta b = m\Delta a$$

When Δa and Δb are defined as vectors based on their reversed direction, the following formula is obtained:

$$\Delta b = m\Delta a \quad \text{(a)}$$

In this case, the positions of the main planes of the projection lens fluctuate in the case of emission of light with the exposure wavelengths and in the case of emission of light with the nonexposure wavelengths, as is shown in FIG. 3 (in FIG. 3 the principal planes fluctuate in the manner of H→h, and H'→h'). It is, therefore, necessary to consider the above described fluctuations of the positions of the principal planes. The positions of the principal planes are fixed by the arrangement of the projection lens and the wavelengths. Therefore, by determining beforehand the mount of movements ΔH and ΔH' of the positions of the principal planes for light with the exposure wavelengths and for light with the nonexposure wavelengths, by the ascertained ΔH and ΔH', the amounts of correction Δa and Δb of the distances between the above described mask and the projection lens and between the projection lens and the workpiece can be corrected.

Figure 4:
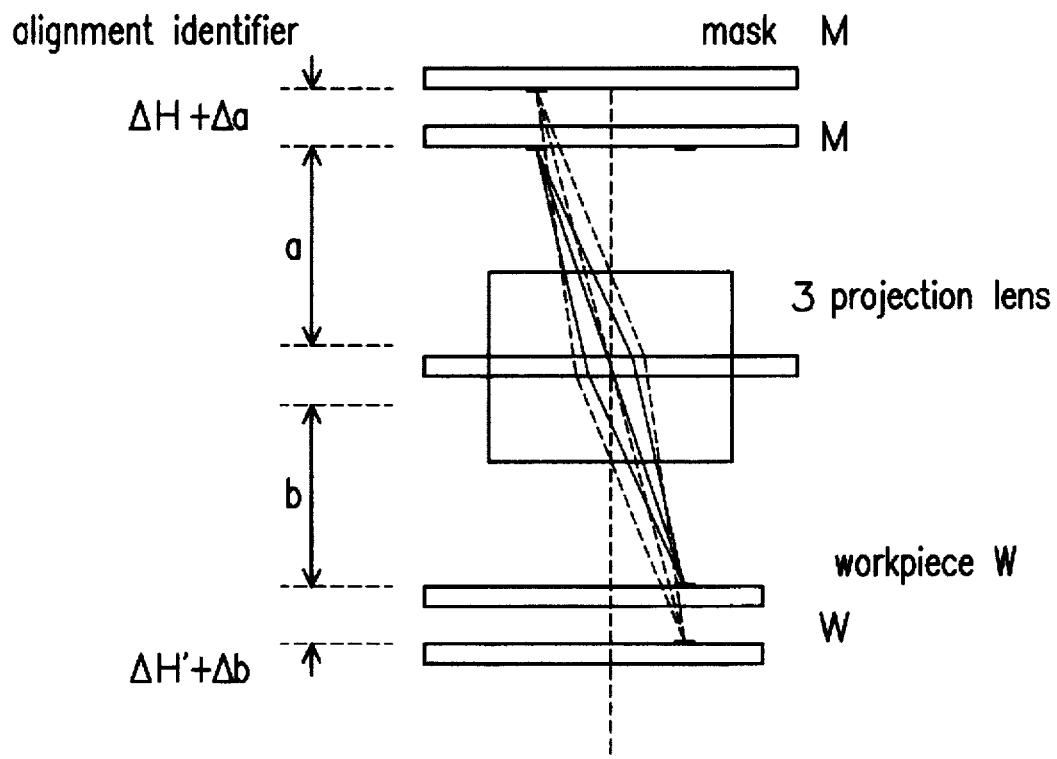
FIG. 4 shows the position of the projection image of the alignment identifier as produced by the exposure light and by the nonexposure light.

If in the emission of light with the exposure wavelengths, the distance between the mask M and projection lens 3 is labelled a and the distance between projection lens 3 and workpiece W is labelled b, when light with the nonexposure wavelength is emitted, as is illustrated in FIG. 4, the magnification factor for emission of light with the exposure wavelengths and the magnification factor for emission of light with the nonexposure wavelengths can be made the same size by the distance between mask M and projection lens 3 being designated a+ΔH+Δa and the distance between projection lens 3 and workpiece W being designated $$b + \Delta H' + \Delta b (= b + \Delta H' + m\Delta a).$$

That the magnification factors can be made the same size, means that the mask identifier in the emission of light with the exposure wavelengths and in the emission of light with the nonexposure wavelengths is projected onto the same position on the workpiece, as is shown in the drawing.

This means that, in the alignment in which light with nonexposure wavelengths is emitted, by moving the positions of the workpiece and the mask relative to the projection lens based on the above described formulas, the mask identifier can be projected onto the same position as during exposure and alignment can be performed without making a focal correction by means of the optical part, such as the parallel flat plate or the like.

How exposure is done in this embodiment is described in the following.

(1) Workpiece W is seated on workpiece drive carrier 5.

(2) As described with respect to FIGS. 3 and 4, the amount of movements of the mask and the workpiece with reference to projection lens 3 is determined and the mask M and workpiece W are moved.

This means that Δa and Δb are determined according to the aforementioned formula (a), and with consideration of the movements of the principal planes of the projection lens, the amount of movements of mask drive carrier 2 and workpiece drive carrier 5 with respect to projection lens 3 is established. Mask drive carrier 2 and the workpiece drive carrier 5 are thus moved, and alignment units 6 are, likewise, moved by coupling with mask M.

This movement can also be automatically executed such that, based on the computation results of arithmetic-logic unit 21 (in FIG. 2), by means of carrier control element 23, drive control of mask drive carrier 2 and workpiece drive carrier 5 is accomplished. Mask drive carrier 2 and workpiece drive carrier 5 can, furthermore, be moved manually by an operator.

(3) Alignment units 6 are inserted, shutters 6g of alignment unit 6 are opened and nonexposure light is emitted from alignment unit 6 onto the mask. In this way, workpiece identifiers WA and mask identifiers MA are detected by image converter 6d and displayed on the monitor 25 (FIG. 2).

Figure 5:
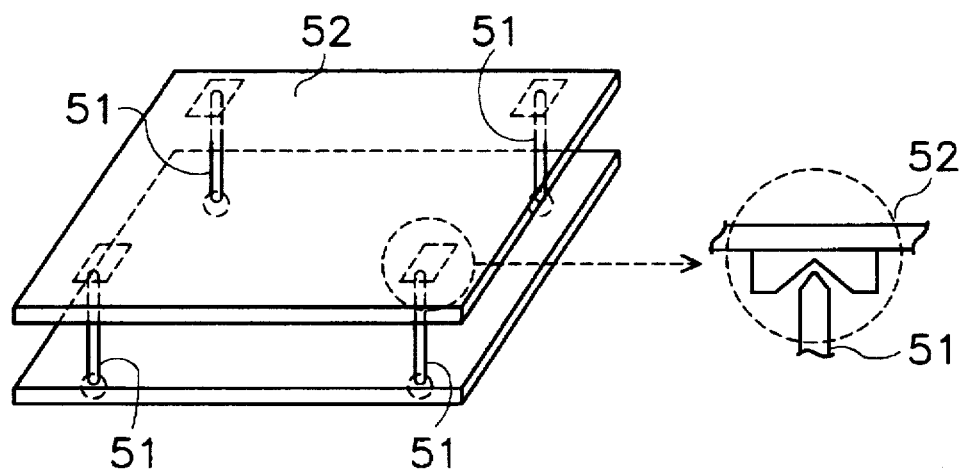

If, when the mask moves in the z-direction, a subtle position change occurs, alignment accuracy drops. Therefore, using a cross roller guide or the like for a movement device above and below mask drive carrier 2, and if necessary by installing the device shown in FIG. 5 for reciprocating motion in mask drive carrier 2, by adjustment of screw 51 and fine adjustment of the incline of mask surface 52, an mount of deviation in the transverse direction thereof of less than or equal to 1 micron can be obtained.

Figure 6:
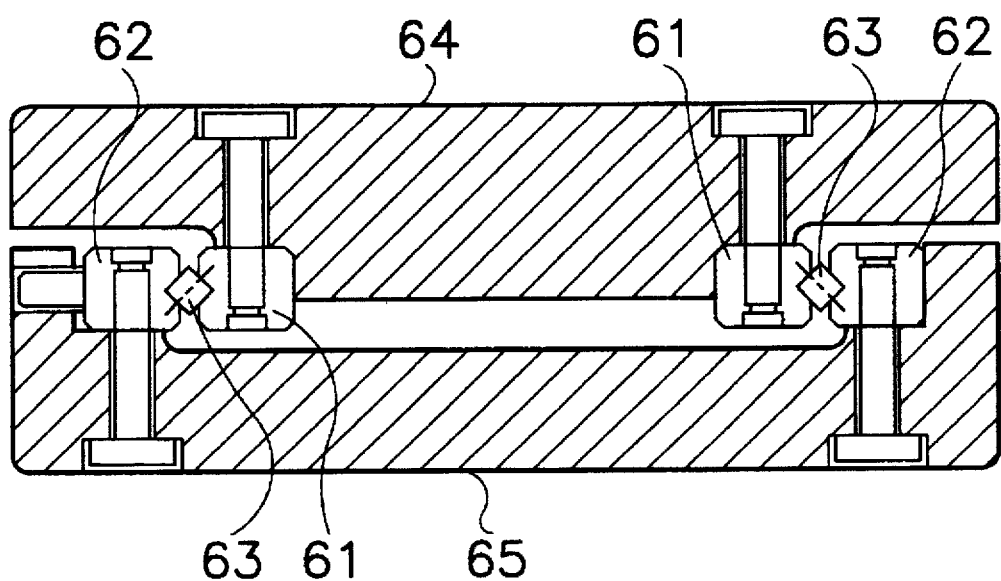
FIG. 6 is a cross-sectional view of an example of an arrangement of a cross roller guide.

FIG. 6 is a cross-sectional representation of the above described cross roller guide which has a configuration in which a roller 63 is located between a V-shaped rail 61 and a V-shaped rail 62 in an alternating orthogonally crossing arrangement, as is shown in the drawing. Second part 65 can be guided without position deviation occurring with reference to first part 64.

(4) Next, workpiece drive carrier 5 or mask drive carrier 2 are moved relative to the mask/workpiece surface in the X-Y-Θ direction and alignment of the mask identifiers and the workpiece identifiers is performed. This alignment process can also be done automatically by an image detected by alignment unit 6 being processed in image processing part 24, and by the workpiece drive carrier 5 or the mask drive carriers being driven by means of carrier control element 23, such that the mask identifiers agree with the workpiece identifiers. This alignment process can, furthermore, also be executed manually by an operator moving the workpiece drive carrier 5 or the mask drive carriers by watching a monitor.

(5) When the alignment process has been completed, shutters 6g of alignment unit 6 are closed.

(b 6) Alignment units 6 are removed.

(7) Mask drive carrier 2 and workpiece drive carrier 5 are returned in the direction of the optical axis by ΔH+Δa and ΔH'+Δb, so that a mask pattern projection surface for exposure light lies on the workpiece W.

(8) Shutter 1a of the light emission device 1 is opened. The exposure light is emitted onto the mask, and thus, exposure on the workpiece is accomplished.

As was described above, in this embodiment, by the measure in which both the mask and also the workpiece are moved with reference to the projection lens, and thus, the magnification factors with respect to exposure light and nonexposure light are brought into agreement with one another, alignment by the nonexposure light can be performed with high accuracy using a simple device without using an optical component, such as a parallel flat plate or the like.

Furthermore, the occurrence of position deviation as the result of inclining of the parallel flat plate is prevented here. Moreover, this measure can also be easily taken in the case of altered exposure light and altered alignment light.

Additionally, according to the invention the workpiece is prevented from becoming fouled by the formation of dust when the parallel flat plate is inserted and removed, since it is not necessary to insert the parallel flat plate in the optical path.

In the above described embodiment, focal correction with respect to the nonexposure light is accomplished by the mask drive carrier and the workpiece drive carrier being moved in the direction of the optical axis of the projection lens. However, the focal length correction can, likewise, be achieved in the manner described below, the relative distances between the projection lens, the mask and the workpiece being changed.

(1) The position of the workpiece drive carrier is established. The projection lens and the mask drive carrier are moved, and thus, a focal length correction is accomplished.

(2) The position of the mask drive carrier is established. The projection lens and the workpiece drive carrier are moved, and thus, a focal length correction is accomplished.

In the above described embodiment the alignment units are located above the mask. However, the alignment units can also be located between the projection lens and the workpiece, the nonexposure light can be emitted from the emission device for the exposure light, and alignment can be accomplished.

Figure 7:
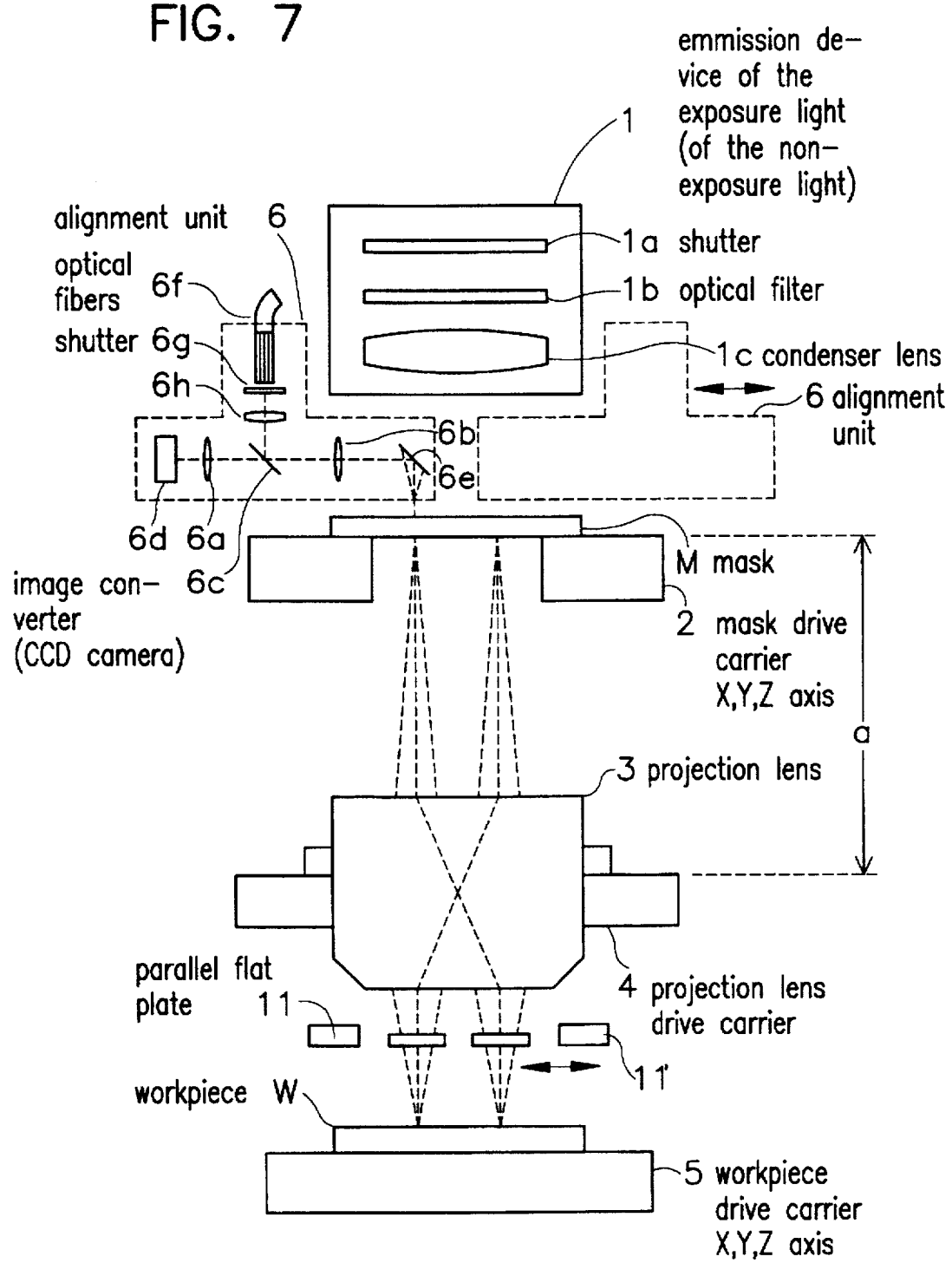
FIG. 7 is a schematic depiction of an arrangement of an exposure device according to a second embodiment of the invention.

FIG. 7 schematically shows the arrangement of an exposure device according to a second embodiment of the invention. The same parts as in FIG. 1 are provided with the same reference numbers as in FIG. 1. In this embodiment, the focal correction with respect to the nonexposure light is performed by changing the distance between mask M and the projection lens and at the same time by inserting parallel flat plates 11, 11' between projection lens 3 and workpiece W.

Figure 13:
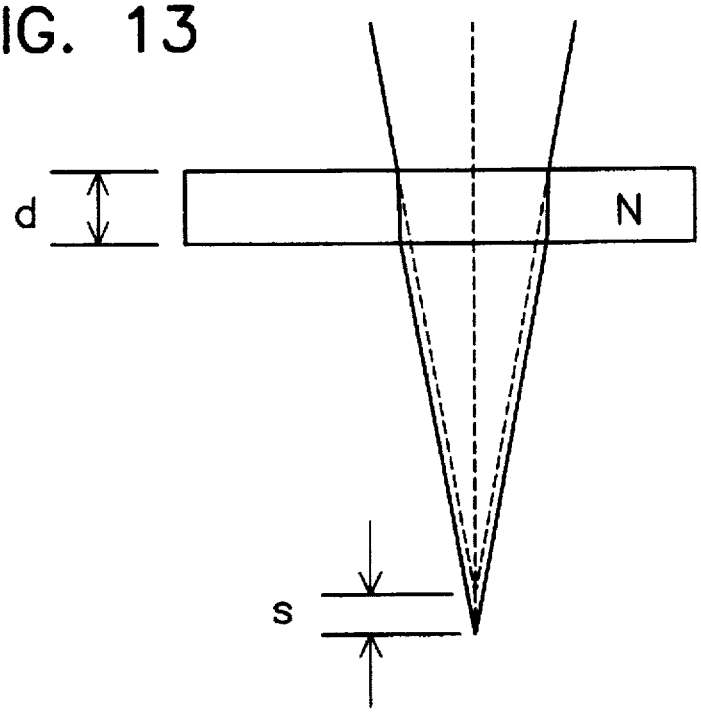
FIG. 13 shows the deviation of the focal position produced by a parallel flat plate.
Figure 14:
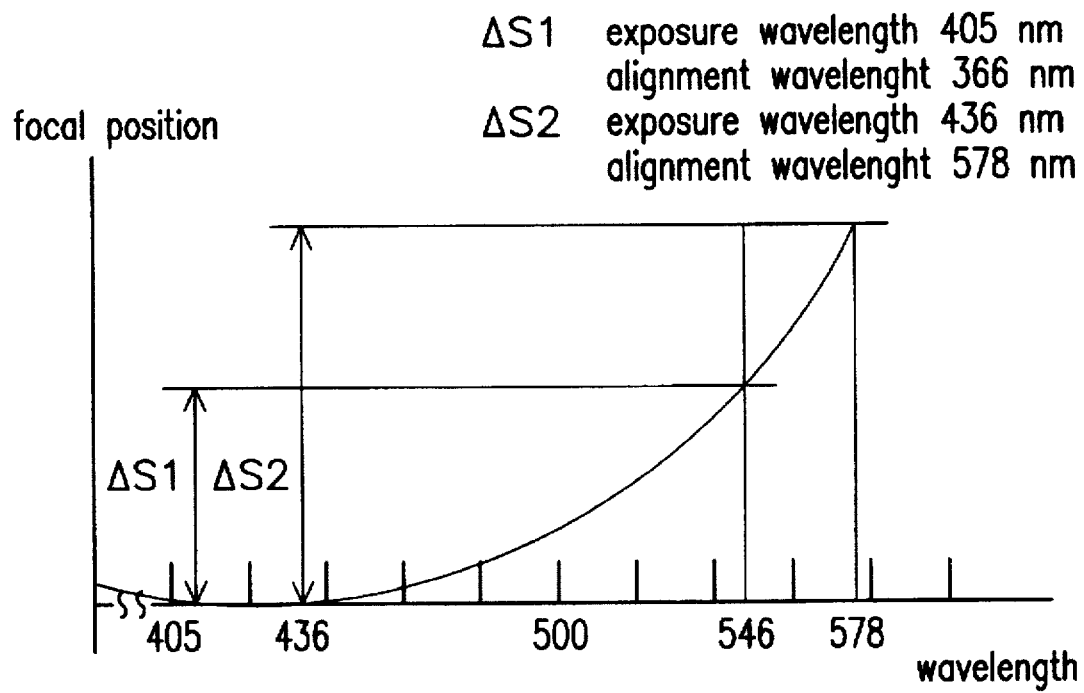
FIG. 14 graphically depicts focal position as a function of wavelength.
Figure 15:
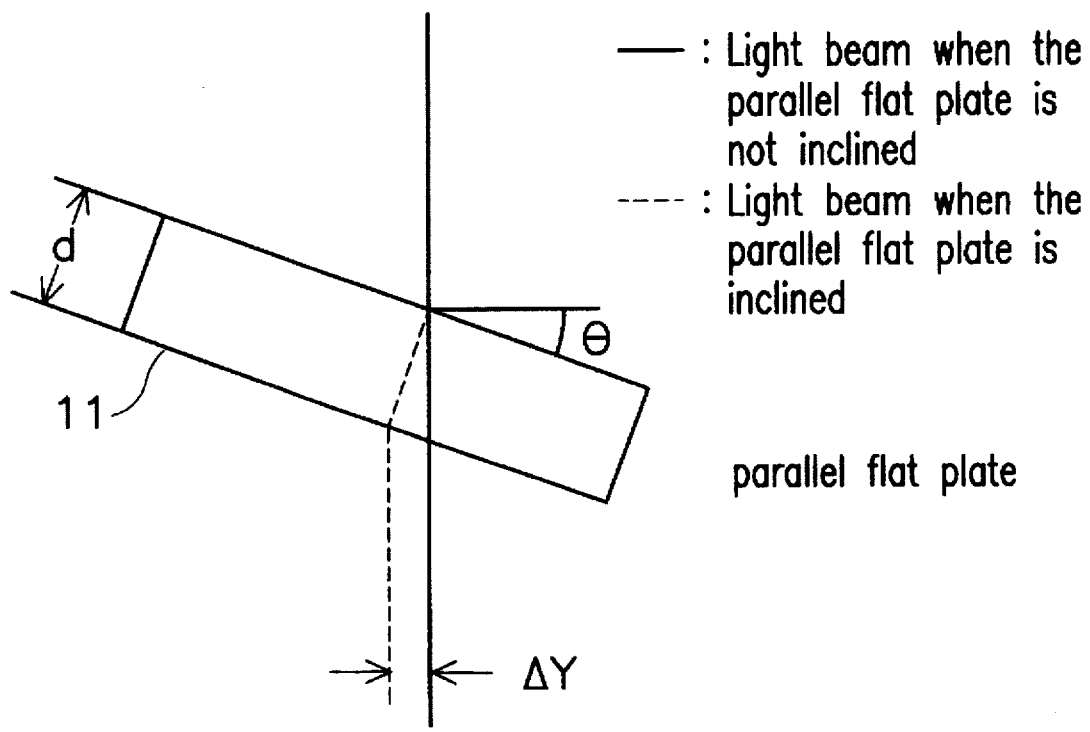
FIG. 15 shows the deviation of the optical path in the case of the parallel flat plate being inserted in through an incline.

If the parallel flat plates are inserted in the optical path, the focal position can be shifted as shown in FIG. 13; this corresponds to a change of the distance between projection lens 3 and workpiece W.

Therefore, parallel flat plates are made available beforehand with a thickness in which a focal length correction can be obtained which corresponds to the amount of correction of the above described distance between the projection lens and the workpiece. When nonexposure light is emitted, the distance is changed between mask M and the projection lens and at the same time parallel flat plates 11, 11' are inserted between projection lens 3 and workpiece W. In this way, as in the first example, the magnification factor in emission of exposure light and the magnification factor in emission of nonexposure light can be made the same.

Exposure is performed in this embodiment in the following manner.

(1) Workpiece W is seated on workpiece drive carrier 5.

(2) As was described relative to FIGS. 3 and 4, the amount of movement of the mask with reference to projection lens 3 is determined, mask M is moved and at the same time parallel flat plates 11, 11' are inserted between the projection lens and workpiece, the plates having a thickness by which a focal length correction can be accomplished which corresponds to the above-described mount of correction. In this case, alignment units 6 are, likewise, moved by coupling with mask M.

This process can also be performed automatically or manually by arithmetic-logic unit 21 (FIG. 2), as in the first embodiment.

(3) Alignment units 6 are inserted, shutters 6g of alignment units 6 are opened and nonexposure light is emitted from alignment units 6 onto the mask.

(4) Next, workpiece drive carrier 5 or the mask drive carrier are moved relative to the mask/workpiece surface in the X-Y-Θ direction, and thus, alignment of the mask identifier and the workpiece identifier is achieved.

(5) When the alignment process has been completed, shutters 6g of alignment unit 6 are closed.

(6) Alignment units 6 are removed.

(7) Mask drive carrier 2 is returned in the direction of the optical axis by ΔH+Δa and at the same time parallel flat plate 11, 11' are removed, so that a mask pattern projection surface produced by exposure light lies on workpiece W.

(8) Shutter 1a of the emission device of exposure light 1 is opened. The exposure light is emitted onto the mask, and thus, exposure on the workpiece is accomplished.

As was described above, in this embodiment, by the measure in which the mask is moved with reference to the projection lens, and at the same time, the parallel flat plate is inserted between the projection lens and the workpiece, and thus, the magnification factors with respect to exposure light and nonexposure light are brought into agreement with one another, the problem of position deviation of the mask identifiers projected onto the workpiece can be prevented by the position of the alignment identifiers, and alignment can be obtained with high precision by nonexposure light using a simple device.

In the above described embodiment, the mask drive carrier is moved in the direction of the optical axis of the projection lens, and at the same time, the parallel flat plate 11 is inserted between the projection lens and the workpiece. However, the focal correction can, likewise, be performed by changing the distance between the projection lens and the workpiece, and at the same time, by inserting the parallel flat plates 11, 11' between the mask and the projection lens.

In the above described embodiment, the alignment units are located above the mask. However, the alignment units can also be located between the projection lens and the workpiece, the nonexposure light emitted from the emission device of the exposure light and alignment accomplished.

In the above described embodiment, two parallel flat plates 11, 11' are made provided and inserted from both sides of the optical path. However, one large parallel flat plate can also be provided and inserted into the optical path from one side of the optical path.

Figure 8:
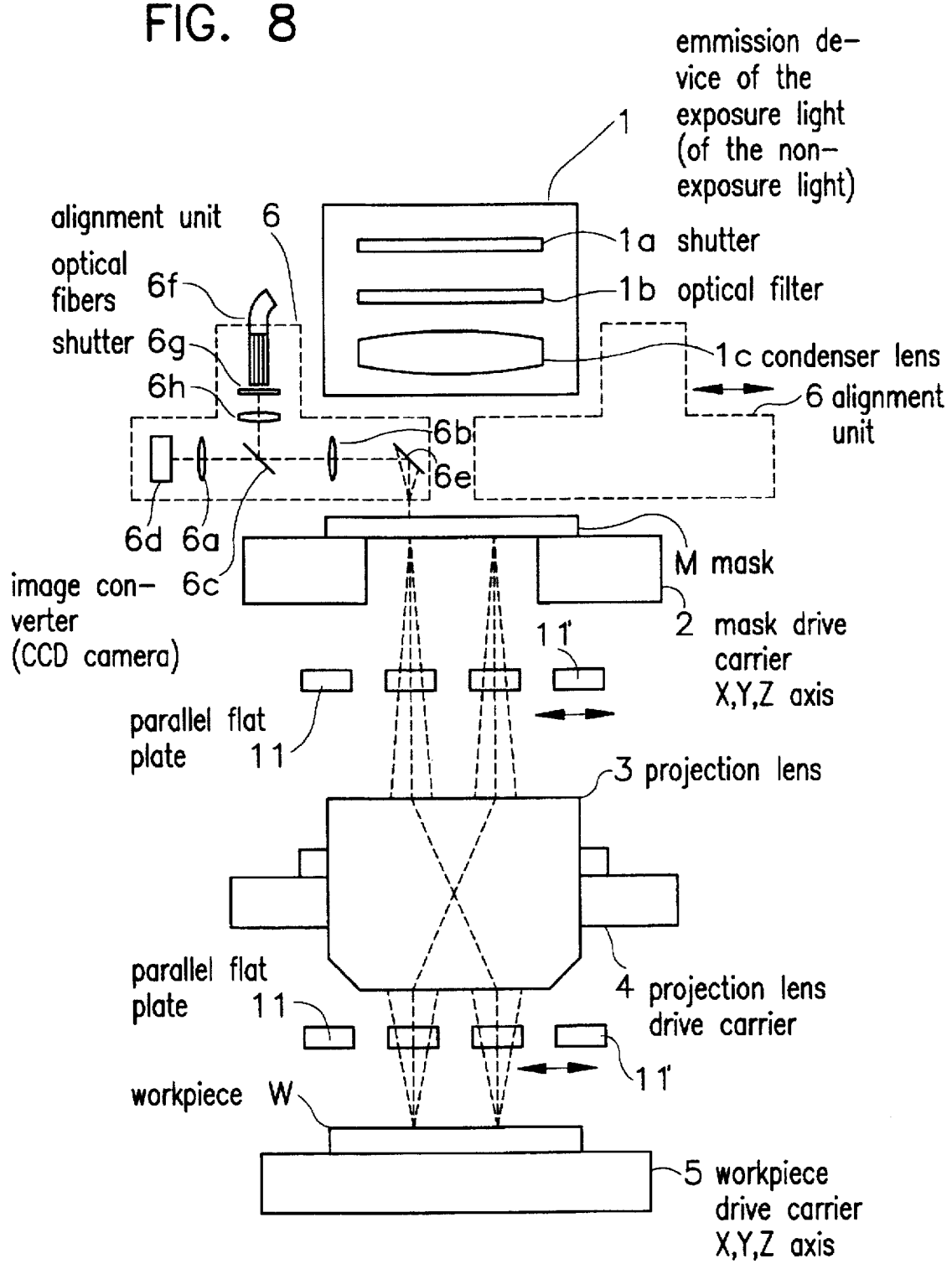
FIG. 8 is a schematic depiction of an arrangement of an exposure device according to a third embodiment of the invention.
Figure 9:
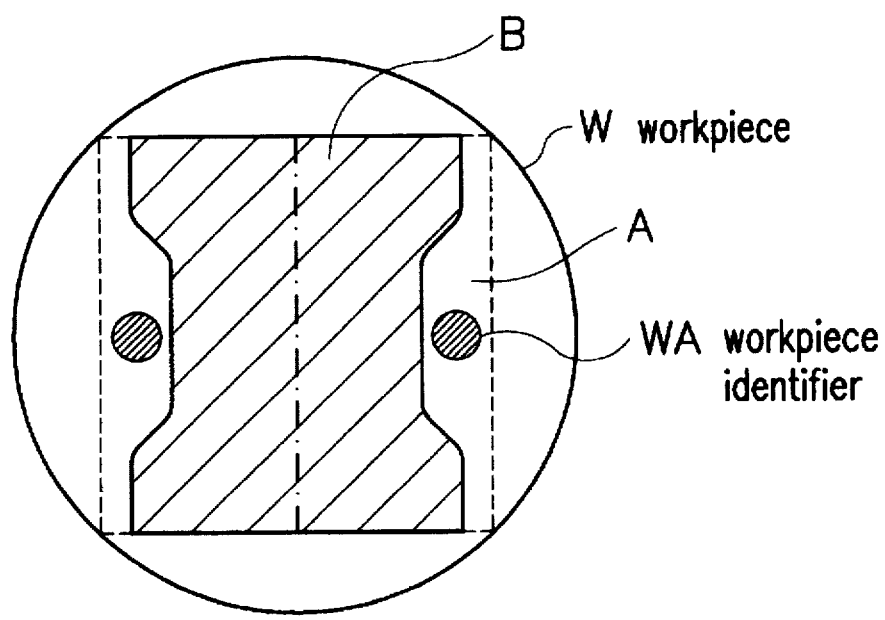
FIG. 9 shows a schematic of a region in which a circuit pattern can be formed when using the exposure light for alignment.
Figure 10:
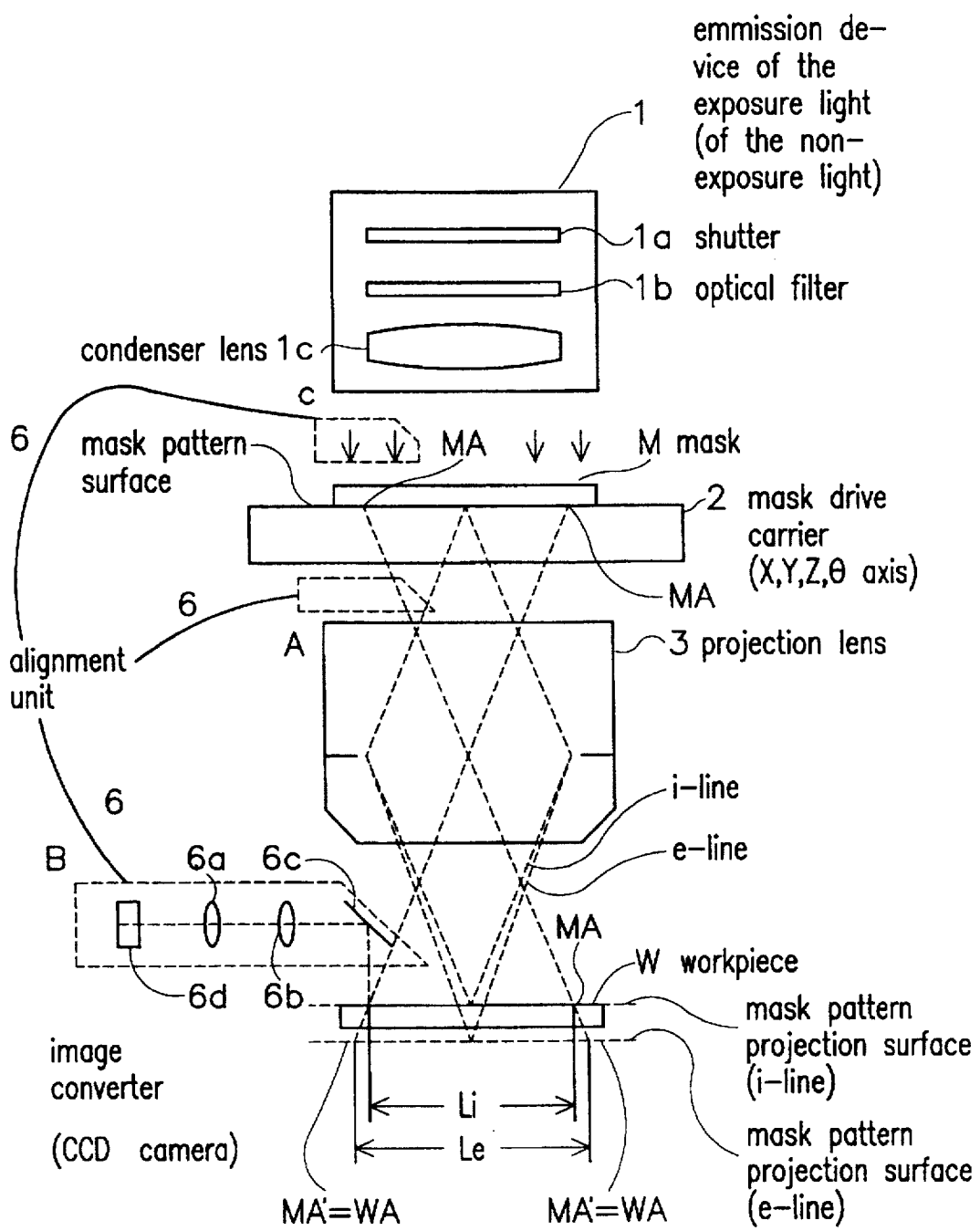
FIG. 10 shows a conventional exposure device arrangement.

FIG. 8 schematically shows the arrangement of an exposure device according to the third embodiment of the invention. The same parts as in FIG. 1 are provided with the same reference numbers as in FIG. 1. In this embodiment parallel flat plates 11 and 11' are inserted between mask M and the projection lens 3 and between projection lens 3 and workpiece W, and thus, the focal length correction is obtained with respect to the nonexposure light.

This means that, in this embodiment, a parallel flat plates are made available beforehand of a thickness by which a focal correction can be performed which corresponds to the amount of correction Δa of the distance between the mask M and the projection lens 3, and the amount of correction of the distance between the projection lens and the workpiece. When nonexposure light is emitted, by inserting parallel flat plates 11 and 11' between mask M and the projection lens 3, and between projection lens 3 and workpiece W, the magnification factors for emission of exposure light and for emission of nonexposure light are made the same size, as in the first embodiment.

In the following, the exposure process for this embodiment is described.

(1) The workpiece W is seated on workpiece drive carrier 5.

(2) Between the mask M and the projection lens 3, the parallel flat plates 11, 11' are inserted having a thickness by which a focal length correction can be obtained which corresponds to the above-described amount of correction. At the same time, between the projection lens 3 and the workpiece W, the parallel flat plates 11, 11' having a thickness by which a focal length correction can be accomplished which corresponds to the above-described amount of correction are inserted. This process can be performed both automatically and manually.

(3) Alignment units 6 are inserted, shutters 6g of alignment units 6 are opened and nonexposure light is emitted from alignment units 6 onto the mask.

(4) Next, workpiece drive carrier 5 or the mask drive carriers are moved relative to the mask/workpiece surface in the X-Y-Θ directions, and thus, alignment of the mask identifier and the workpiece identifier is achieved.

(5) When the alignment process has been completed, shutters 6g of alignment units 6 are closed.

(6) Alignment units 6 are removed.

(7) Parallel flat plates 11 and 11' are removed so that a mask pattern projection surface by exposure light lies on workpiece W.

(8) Shutter 1a of the emission device of exposure light 1 is opened. The exposure light is emitted onto the mask M, and thus, exposure on the workpiece is accomplished.

As was described above, in this embodiment, by the measure in which the parallel flat plates are inserted between the mask and the projection lens and between the projection lens and workpiece, the magnification factors with respect to exposure light and nonexposure light are brought into agreement with one another, occurrence of the problem of position deviation of the mask identifier projected onto the workpiece can be prevented by the position of the alignment identifiers, and alignments can be obtained with high precision by the nonexposure light using a simple device.

Especially in this embodiment, by the measure in which by inserting in the parallel flat plates the magnification factor with respect to exposure light and magnification factor with respect to nonexposure light are brought into agreement with one another, the fine adjustment which is done in the prior art, such as adjustment of the inclination of the parallel flat plate or the like, is unnecessary.

Therefore, alignment with high accuracy can be performed.

In the above described embodiment, the alignment units are located above the mask. However, the alignment units can also be located between the projection lens and the workpiece, the nonexposure light can be emitted from the emission device of the exposure light and thus alignment can be accomplished.

In the above described embodiment, two parallel flat plates are inserted in from both sides of the optical path. However, one large parallel flat plate can also be made available and inserted into the optical path from one side of the optical path.

Effect of the Invention

As described above the following effects according to the invention can be obtained:

(1) By the measure in which changes of the focal length and the movements of the principal planes of the projection lens by wavelengths are taken into account and the length of the optical path of the optical system is adjusted, such that the magnification factor in emission of nonexposure light and the magnification factor in emission of exposure light are brought into agreement with one another, alignment can be obtained with high precision by the nonexposure light using a simple device without using an optical component, such as a parallel flat plate or the like.

In particular, the occurrence of the problem of position deviation of the mask identifiers projected onto the workpiece is prevented by the position of the alignment identifiers.

Furthermore, the occurrence of position deviation as the result of the inclination of the parallel flat plate is prevented and this measure can also be easily taken in the case of altered exposure light and altered alignment light.

Furthermore, according to the invention the workpiece is prevented from becoming fouled by the formation of dust when the parallel flat plate is inserted in and removed, since it is not necessary to insert the parallel flat plate in the optical path.

(2) By the measure in which the optical component is inserted between the mask and the projection lens and/or between the projection lens and the workpiece for purposes of focal length correction and in which the distance is adjusted between the projection lens and the workpiece or between the mask and the projection lens where the above described optical component is not inserted, alignment by the nonexposure light can be performed without moving the workpiece drive carrier or the mask drive carrier in the direction of the optical axis, and the effect of position deviation on accuracy when the carrier moves can be eliminated, and thus, alignment can be obtained with high precision.

It is to be understood that although preferred embodiments of the invention have been described, various other embodiments and variations may occur to those skilled in the art. Any such other embodiments and variations which fall within the scope and spirit of the present invention are intended to be covered by the following claims.

I claim:

1. A process for positioning of a mask relative to a workpiece, comprising the steps of:

adjusting the length of an optical path of an optical system in response to changes in focal length and movements of principal planes of a projection lens as a function of light wavelengths through the optical system in a manner such that a magnification factor of the optical system in emission of nonexposure light is equal to a magnification factor of the optical system in emission of exposure light;

emitting the nonexposure light onto a workpiece having alignment identifiers via a mask having alignment identifiers;

detecting the alignment identifier of the workpiece and the alignment identifier of the mask; and executing relative movement between the workpiece and the mask in a plane parallel thereto until the alignment identifiers of the workpiece and the alignment identifiers of the mask come to lie one on top of the other.

2. Process for positioning of a mask relative to a workpiece according to claim 1, comprising the further step of adjusting the relative distances of the mask, projection lens and workpiece by moving at least two of the mask, projection lens and workpiece, and wherein the adjusting is executed in a manner such that the magnification factor in nonexposure light matches the magnification factor in exposure light.

3. Process for positioning of a mask relative to a workpiece according to claim 1, wherein focal length correction is performed by inserting an optical component into the optical path between the projection lens and one of the workpiece and the mask, and at same time, adjusting the distance between the projection lens and the other of said workpiece and mask so as to match the magnification factor of the nonexposure light with the magnification factor of the exposure light.

4. Process for positioning of a mask relative to a workpiece according to claim 1, wherein focal length correction is performed by inserting an optical component between the mask and the projection lens and between the projection lens and the workpiece so as to match the magnification factor of the nonexposure light with the magnification factor of the exposure light.

5. Process for positioning a mask relative to a workpiece according to claim 1, wherein said executing step is performed using a mask drive carrier for movement of the mask having alignment identifiers thereon, a workpiece drive carrier for movement of the workpiece, and a control means for controlling movements of the mask drive carrier and the workpiece drive carrier.

6. Process for positioning a mask relative to a workpiece according to claim 5, wherein said detecting step is performed using an image recording means for image recording of the alignment identifiers of the workpiece and the alignment identifiers of the mask; and wherein said control means controls the movements of the mask drive carrier and the workpiece drive carrier to cause the alignment identifiers of the workpiece and the alignment identifiers of the mask to lie one on top of the other based on the images recorded by said recording means.

7. Process for positioning a mask relative to a workpiece according to claim 1, wherein said detecting step is performed using an image recording means for image recording of the alignment identifiers of the workpiece and the alignment identifiers of the mask.

8. Process for positioning a mask relative to a workpiece according to claim 1, further comprising the step of emitting exposure light onto the workpiece after the emitted nonexposure light has been used to detect the workpiece and alignment identifiers and to bring the workpiece and alignment identifiers to come to lie one on top of the other.

9. Device for positioning of a mask to a workpiece, comprising:

an emission device for emission of ultraviolet rays onto a mask, a mask, a drive carrier for movement of the mask having alignment identifiers thereon, a projection lens, a workpiece having alignment identifiers thereon, a workpiece drive carrier for movement of the workpiece, image recording means for image recording of the alignment identifiers of the workpiece and the alignment identifiers of the mask, and control means for controlling movements of the mask drive carrier and the workpiece drive carrier; and wherein said control means comprises means for taking into account changes of the focal length and movements of principal planes of the projection lens due to differences in wavelengths of light emitted, means for adjusting an optical path length between the emission device and the workpiece in a manner causing a magnification factor in emission of nonexposure light to match a magnification factor in emission of exposure light, and means for executing relative movement between the workpiece drive carrier and the mask drive carrier in directions parallel thereto when nonexposure light is emitted onto the mask and in a manner causing the alignment identifiers of the workpiece and the alignment identifiers of the mask to lie one on top of the other.

10. Device for positioning a mask relative to a workpiece according to claim 9, wherein said emission device comprises means for selectively emitting light of nonexposure wavelengths for alignment purposes and light of exposure wavelengths for exposure purposes, said control means causing exposure light to be emitted onto the workpiece after the emitted nonexposure light has been used to detect the workpiece and alignment identifiers and to bring the workpiece and alignment identifiers to come to lie one on top of the other.

\* \* \* \* \*